United States Patent
Bolotin et al.

(10) Patent No.: US 11,703,544 B2
(45) Date of Patent: Jul. 18, 2023

(54) CURRENT SENSE MULTI-CHIP MODULE

(71) Applicant: CALIFORNIA INSTITUTE OF TECHNOLOGY, Pasadena, CA (US)

(72) Inventors: Gary S. Bolotin, Pasadena, CA (US); Don J. Hunter, LaVerne, CA (US); Malcolm L. Lias, Pasadena, CA (US); Ben Cheng, Pasadena, CA (US); John J. Waters, Pasadena, CA (US); Sunant Katanyoutanant, Monterey Park, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 175 days.

(21) Appl. No.: 17/339,502

(22) Filed: Jun. 4, 2021

(65) Prior Publication Data
US 2021/0389377 A1    Dec. 16, 2021

Related U.S. Application Data

(60) Provisional application No. 63/037,447, filed on Jun. 10, 2020.

(51) Int. Cl.
| | | |
|---|---|---|
| *G01R 31/34* | (2020.01) | |
| *H02P 29/60* | (2016.01) | |
| *G01R 19/32* | (2006.01) | |
| *B64G 1/66* | (2006.01) | |
| *G01R 19/22* | (2006.01) | |

(52) U.S. Cl.
CPC .............. *G01R 31/34* (2013.01); *B64G 1/66* (2013.01); *G01R 19/22* (2013.01); *H02P 29/60* (2016.02)

(58) Field of Classification Search
CPC .......... G01R 1/20; G01R 1/203; G01R 19/22; G01R 31/34; G01R 31/343; H02P 29/0022; H02P 29/60–66
See application file for complete search history.

(56) References Cited

U.S. PATENT DOCUMENTS

| | | | |
|---|---|---|---|
| 2004/0027083 A1* | 2/2004 | Suzuki ................. | B62D 5/0487 318/400.22 |
| 2007/0164775 A1* | 7/2007 | Billingsley ............ | G01R 1/203 324/754.05 |
| 2009/0212733 A1* | 8/2009 | Hsieh ..................... | H02P 27/08 318/729 |

(Continued)

OTHER PUBLICATIONS

Bolotin, G., et al., "Cold Survivable Distributed Motor Controller (CSDMC)," IEEE Aerospace Conference, Mar. 2019. 10 Pages, doi: 10.1109/AERO.2019.8742005.

(Continued)

*Primary Examiner* — Huy Q Phan
*Assistant Examiner* — David B Frederiksen
(74) *Attorney, Agent, or Firm* — Steinfl + Bruno LLP

(57) ABSTRACT

Current sensing devices that are capable of surviving harsh ambient environment of ocean worlds, such as Jupiter and Saturn moons are disclosed. The described devices can meet 300 Krad radiation requirements and can survive at cold temperatures down to −184° C. Exemplary implementations of the constituent circuits of the devices are presented. A scheduling algorithm to perform various measurement by the disclosed current sensing devices is also described.

13 Claims, 10 Drawing Sheets

(56) References Cited

U.S. PATENT DOCUMENTS

| | | | | |
|---|---|---|---|---|
| 2011/0241723 | A1* | 10/2011 | Abel | G01R 31/343 |
| | | | | 324/765.01 |
| 2012/0212243 | A1* | 8/2012 | Neidorff | G01R 19/0092 |
| | | | | 324/713 |
| 2015/0214882 | A1* | 7/2015 | Suzuki | H02P 29/0241 |
| | | | | 318/400.27 |
| 2015/0362528 | A1* | 12/2015 | Pu | G01R 19/2509 |
| | | | | 324/127 |
| 2016/0033559 | A1* | 2/2016 | Kuramochi | H02P 29/027 |
| | | | | 324/537 |
| 2019/0165784 | A1* | 5/2019 | Hunter | H01L 24/83 |

OTHER PUBLICATIONS

Bolotin, G., et al., "Compact Low Power Avionics for the Europa Lander Concept and Other Missions to Ocean Worlds," IEEE 68th Electronic Components and Technology Conference (ECTC), Mar. 2018, pp. 1813-1823. 11 Pages. doi: 10.1109/ECTC.2018.00272.

Hunter, D., et al., "Compact Low Power Avionics for the Europa Lander Concept and Other Missions to Ocean Worlds," 2018 IEEE 68th Electronic Components and Technology Conference (ECTC), San Diego, California, May 29-Jun. 1, 2018. 11 Pages.

Hunter, D., et al., "Miniature JPL Universal Instrument Bus (UNI-BUS)," Annual Report. JPL Task #R.14.166.016 / Proposal #131 FY16. 2014. 6 Pages.

Hunter, D.J., et al., "Conceive, Believe and Achieve; A Path to Miniaturization, Cots Infusion, And Size Weight and Power Realization for Flight," 39th AAS Annual Guidance and Control Conference, Feb. 5-Feb. 10, 2016. http://hdl.handle.net/2014/46043. 12 Pages.

Hunter, D.J., "Integrated Avionics System (IAS), Integrating 3-D Technology on a Spacecraft Panel", published in Proceedings, IEEE Aerospace Conference, 2002, pp. 2185-2191 vol. 5 and presented to IPACK2003-35249, Technical Conference and Exhibition, Jul. 6-11, 2003. 8 Pages.

\* cited by examiner

CURRENT SENSE MULTI-CHIP MODULE

CROSS REFERENCE TO RELATED APPLICATIONS

The present application claims priority to U.S. Provisional Application No. 63/037,447, filed on Jun. 10, 2020 and incorporated herein by reference in its entirety.

STATEMENT OF GOVERNMENT GRANT

This invention was made with government support under Grant No. 80NMO0018D0004 awarded by NASA (JPL). The government has certain rights in the invention.

FIELD

The present disclosure is related to current sense modules (CSMs), and more particularly, to current sense modules that are capable of surviving the harsh ambient environment of ocean worlds, such as Europa (one of the Galilean moons orbiting Jupiter) and Enceladus (one of the moons orbiting Saturn).

BACKGROUND

Due to the harsh ambient environment and extreme conditions, development of space missions to Ocean Worlds as such as Europa and Enceladus is a highly challenging task. As an example, electronic modules implemented as part of the lander design are needed to meet stringent requirements such as very high radiation levels and extremely cold temperatures. The electronic circuits and sensor modules used as part of, for example, Europa orbiter and lander are often required to meet radiation levels of up to 300 Krad while surviving temperatures down to −184° C.

Therefore, as part of the overall design of the Europa lander, there is a need for electronic modules and sensors that are capable of surviving specific radiation and temperature requirements as described above while providing the desired functionalities.

SUMMARY

The disclosed methods and devices address the described challenges and provide practical solutions to the above-mentioned needs. More in particular, a current sense module (CSM) that may be used as part of a motor control card of the Europa lander is disclosed. The described CSM has a radiation tolerance of up to and including 300 Krad and can survive at temperatures down to −184° C.

According to a first aspect of the present disclosure, a current sensing module for measuring a motor phase current is disclosed, the current sensing module comprising: at least one sensing resistor disposed in-line with a phase of a motor; and a current sensing circuit with two input terminals coupled across the at least one sensing resistor; the current sensing circuit being configured to amplify a voltage across the at least one sensing resistor, thereby generating an amplified voltage, wherein the current sensing module is configured to operate at radiation levels of up to and including 300 Krad and survive temperatures down to and including −184° C.

Further aspects of the disclosure are provided in the description, drawings and claims of the present application.

DETAILED DESCRIPTION

Throughout the disclosure, the term "surviving and/or survive cold temperatures down to −184° C." refers to the cases/applications where the electronic circuit meets a storage temperature requirement of −184 ° C.

Figure 1A:
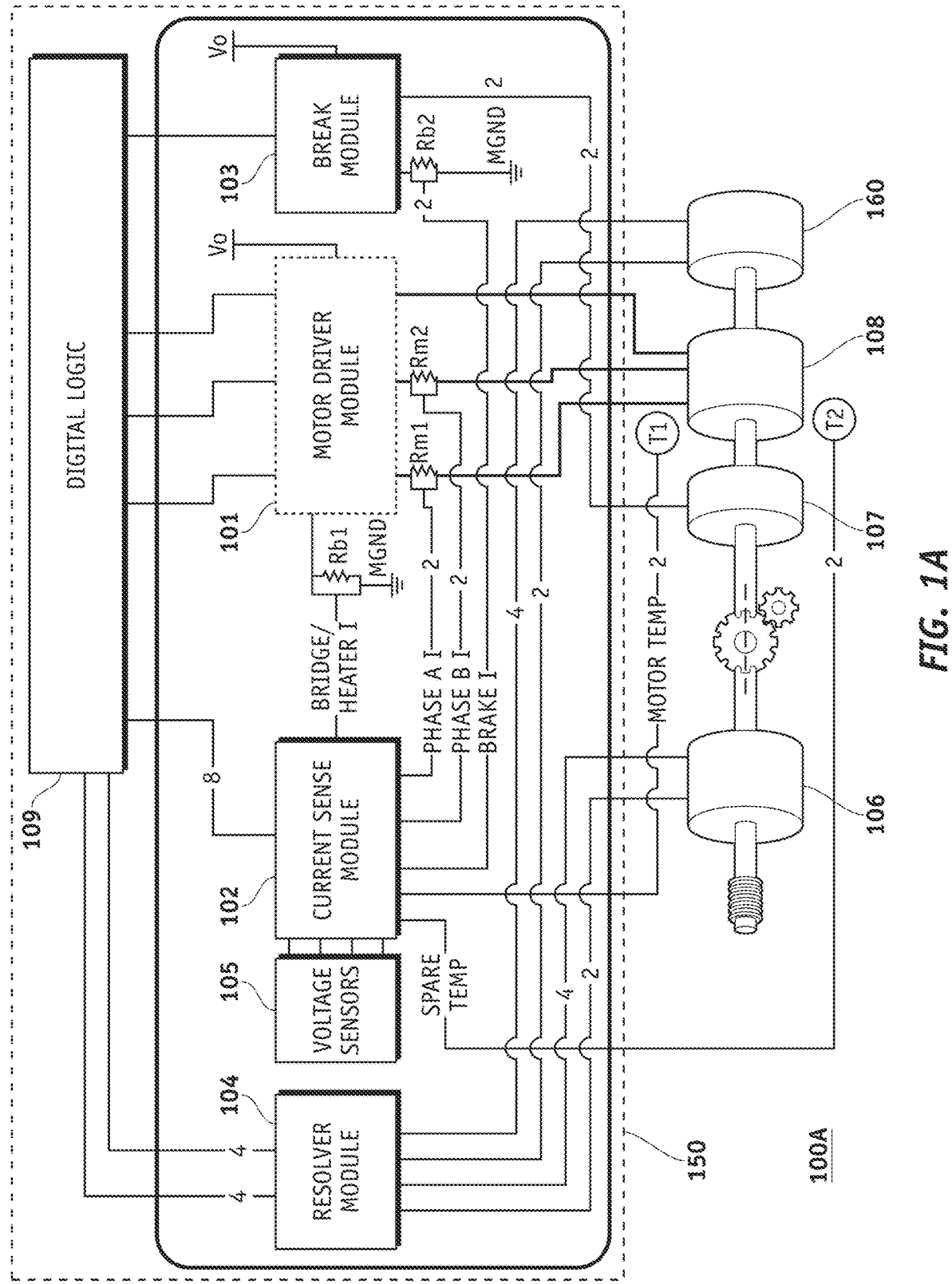
FIG. 1A shows an exemplary motor control arrangement according to an embodiment of the present disclosure.

FIG. 1A shows an exemplary motor control arrangement (100A) that may be used as part of, for example, a lander deployed for a space mission to cold environments such as Europa. Motor control arrangement (100A) comprises motor control module (150) including motor driver module (101), CSM (102), brake module (103), resolver module (104), and digital logic (109). Motor driver module (101) implements a three-phase h-bridge for driving motor (108). The function of CSM (102) is to measure the motor phase currents along with collecting telemetry for the motor control module (150). Brake module (103) provides current to drive brake (107). While interfacing with shaft position resolver (106) and commutation resolver (160), the function of resolver module (104) is to measure the position of motor (108).

Figure 1B:
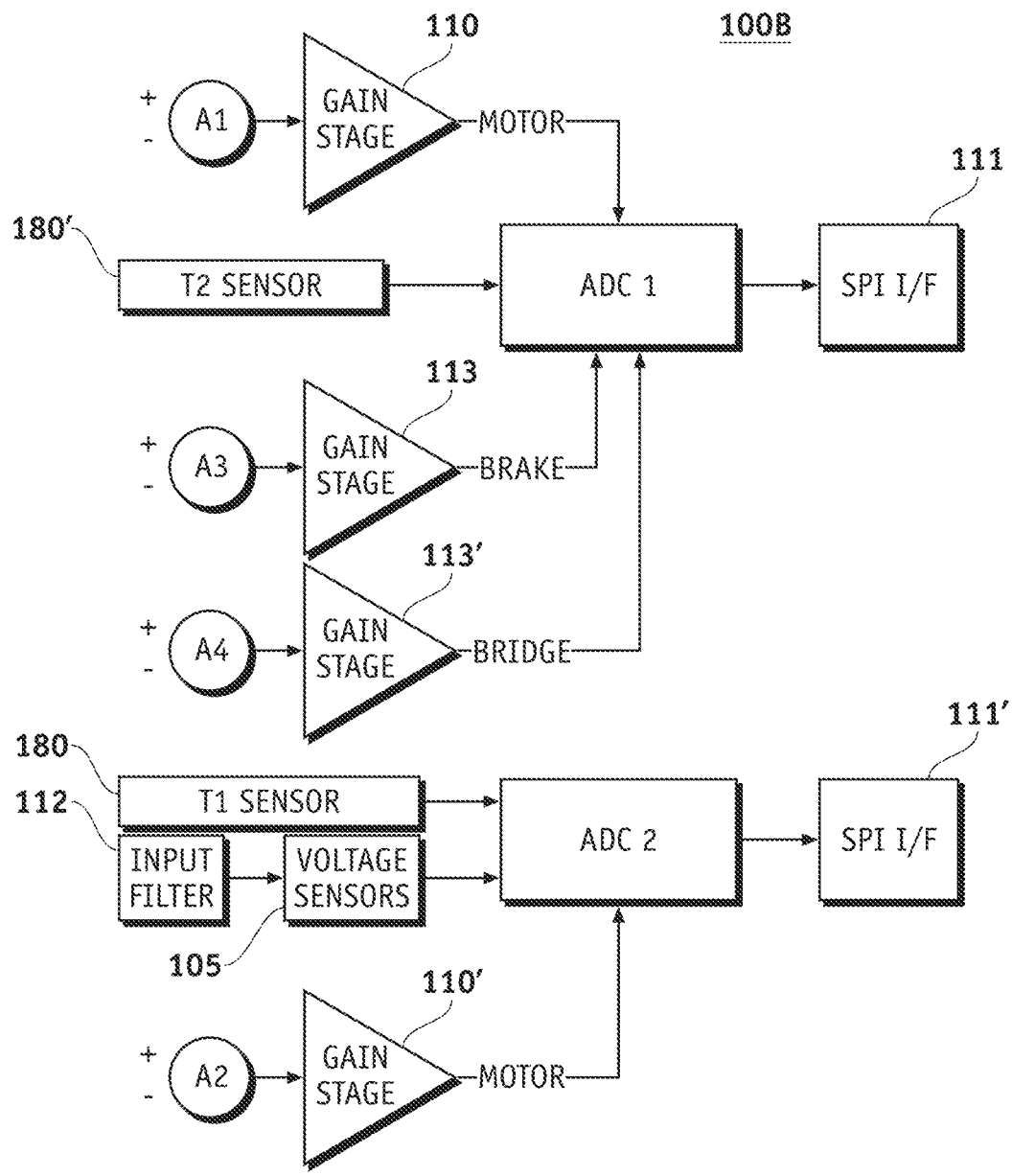
FIG. 1B shows an exemplary implementation of a current sense module according to an embodiment of the present disclosure.

As an exemplary implementation of CSM (102) of FIG. 1A, FIG. 1B shows a CSM (100B) according to an embodiment of the present disclosure. CSM (100B) comprises current sensors (A1, A2, A3, A4) and their respective gain stages (110, 110', 113, 113'). Current sensors (A1, A2) are bidirectional and are used to measure currents of two phases of a 3-phase motor, e.g. phase A and phase B. The current in the third phase, i.e. phase C, can be determined by doing nodal analysis at the motor and applying Kirchhoff's law:

$$\text{phase } A + \text{phase } B + \text{phase } C = 0 \quad (1)$$

In accordance with the teachings of the present disclosure, accurate motor current measurement enabled by CSM (100B) may be used in torque control because motor current is proportional to motor torque per the equation shown in below:

$$I_{motor} = \alpha \tau \quad (2)$$

where τ represents the motor torque.

With reference to FIGS. 1A-1B and eq. (2) above, current control is generally preferred over voltage control because voltage is out of phase with current when driving an inductive load such as a motor. The ability to control current keeps the current in phase with the actual mechanism that drives the motor. As shown in FIG. 1B, each of the sensors (A1, ..., A4) has a pair of inputs represented by +/− signs in FIG. 1B. The +/− inputs to current sensors (A1, A2) represent the voltage sampled across series resistors (Rm1, Rm2) of FIG. 1A. Such resistors are disposed in line with their respective motor phases. According to embodiments of the present disclosure, the current measurement performed by sensors (A1, A2) is also important in fault protection. Motor (108) of FIG. 1A may have a phase-to-phase resistance of, for example, less than 1Ω. As an example, on a 28V bus, currents in excess of 20 A may flow resulting in burning out the motor. Current limiting enabled by CSM (100B) prevents this from happening.

With further reference to FIGS. 1A-1B, CSM (100B) further comprises two (ADCs) analog-to-digital converters (ADC1, ADC2) configured to received current measurements provided by current sensors (A1, ..., A4). In accordance with the teachings of the present disclosure, the bi-directional phase current sensor (A1, A2) circuits are split between the 2 ADCs so that they may be sampled at the same time by digital logic (109) to ensure simultaneous measurements of motor phase current for improved accuracy. By way of example and not of limitation, each of the analog-to-digital converters (ADC1, ADC2) may include 8 channels that can be multiplexed in order to read a specific channel via respective standard peripheral interfaces (111, 111'). Also shown in FIG. 1B, are current sensors (A3, A4) that are used to measure brake and bridge currents respectively. Bridge current is sensed by measuring the voltage across resistor (Rb1) of FIG. 1A. Similarly, brake current measurement is performed using the voltage across resistor (Rb2) of FIG. 1A.

With continued reference to FIGS. 1A-1B, motor temperature (T1) is also measured by temperature sensor (180), and then sampled by digital logic (109) via a corresponding channel of analog-to-digital converter (ADC2). Moreover, a spare temperature (T2) measurement performed by temperature sensor (180') is also available via analog-to-digital converter (ADC1). In order to ensure the health of various voltage levels throughout the module, such voltage levels are monitored periodically by voltage sensors (105) and the resulting measurements are sampled at the associated channel of the analog-to-digital converter (ADC2) by digital logic (109). For a smoother, glitch-free voltage measurement, and in order to avoid possible voltage transients, an input filter (112) may be implemented.

Figure 1C:
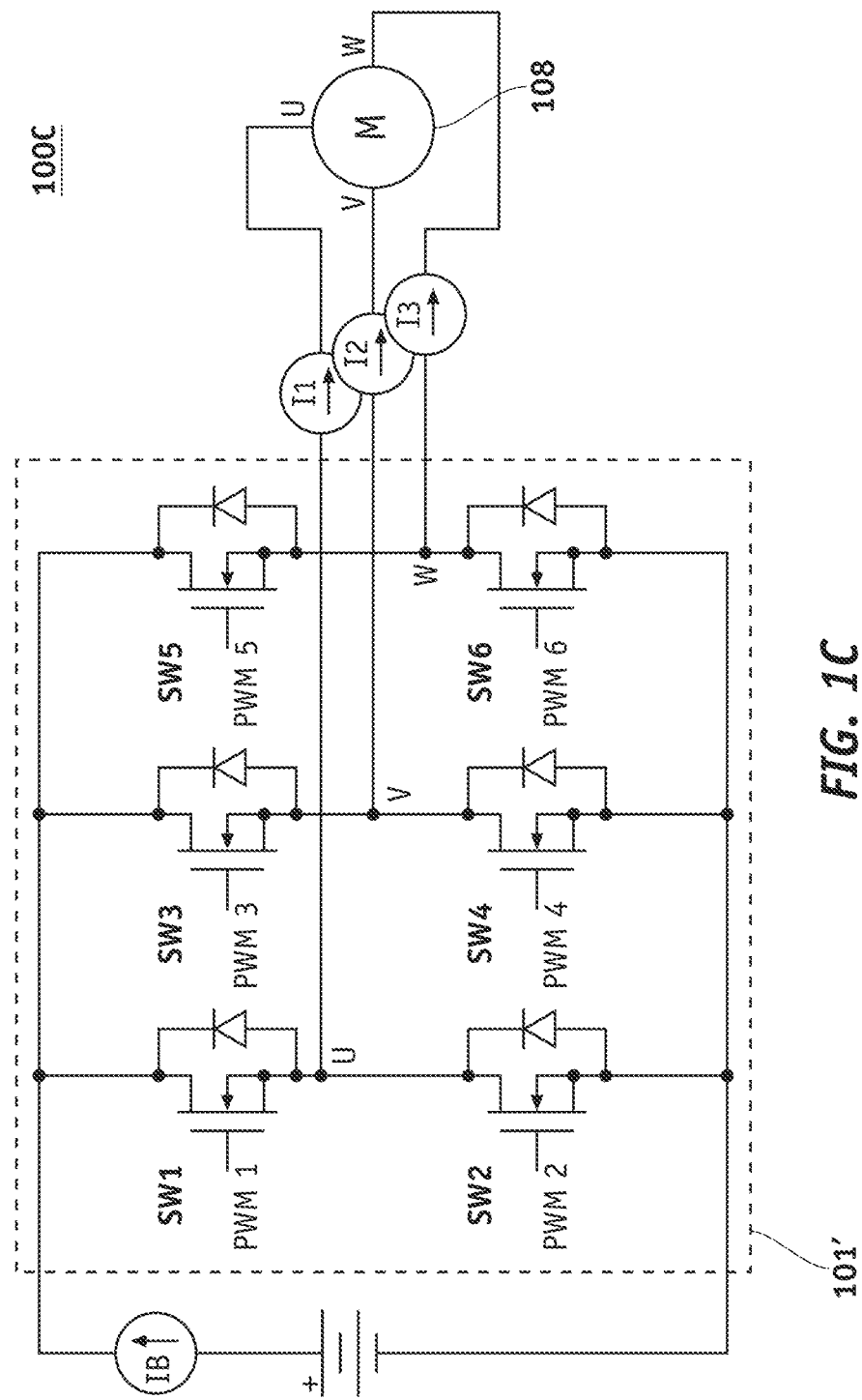
FIG. 1C shows a motor driver module.

FIG. 1C shows motor driver module (101') which is an exemplary implementation of motor driver module (101) of FIG. 1A. Motor driver module (101') provides phase currents (11, 12, 13) to motor (108) and includes three MOSFET-based half-bridge drivers consisting of MOSFET switches (SW1, ..., SW6) together with their respective control pulses (PWM1, ..., PWM6) that are generated by digital logic (109) of FIG. 1A. Also shown in FIG. 1C is bridge current (1B). As mentioned previously, motor phase currents are measured using the voltage across sense resistors disposed in-line with motor phases. This is in contrast with some existing motor current sensing methods where only the bridge current is measured to determine motor current. The problem with such existing measurement techniques is that they do not accurately track motor current 100% of the time. The motor current circulates in the MOSFET switches (SW1, ..., SW6) of the drive circuitry during the unpowered portion of respective control pulses (PWM1, ..., PWM6) duty cycle. Current does not pass through the in-line current sense resistor during this time period. This makes the accurate measurement of motor current difficult when the control pulse duty cycle is small.

The person skilled in the art will appreciate that the disclosed current sense module addresses this problem by accurately measuring directly the motor phase currents.

In what follows, exemplary implementations of various sensors of FIG. 1B will be described.

Figure 2:
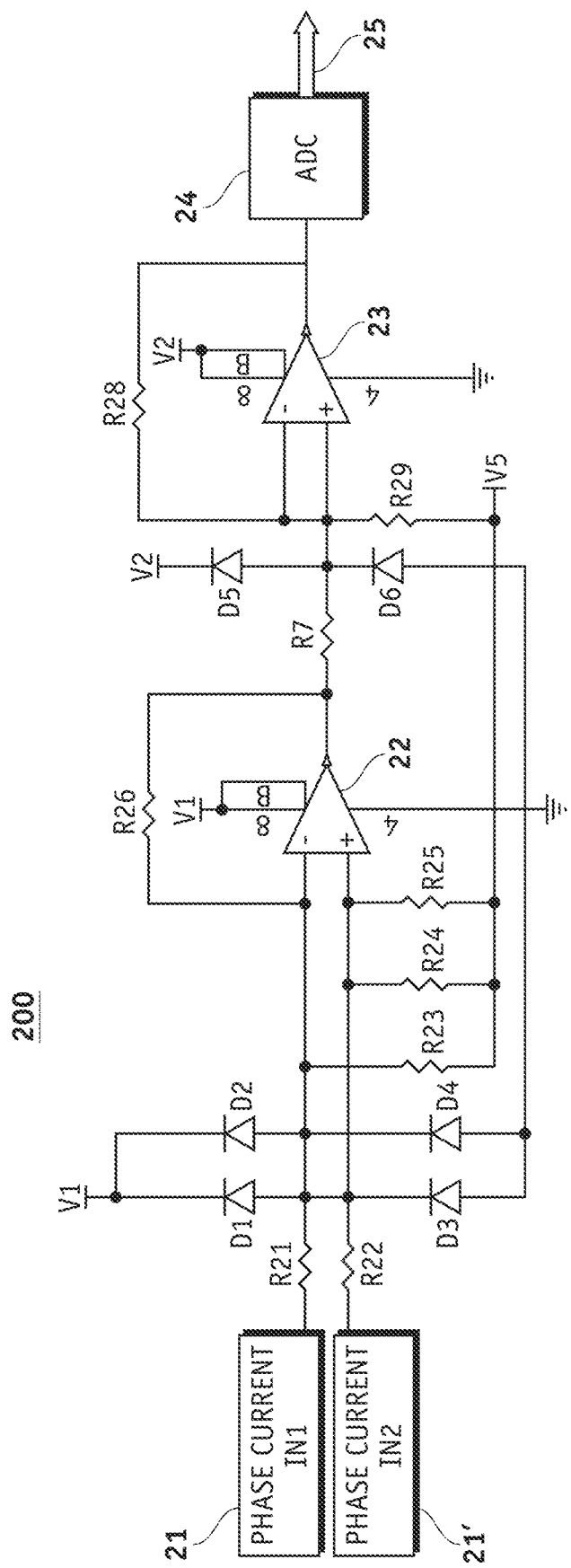
FIG. 2 shows an exemplary current sensor according to an embodiment of the present disclosure.

FIG. 2 shows an exemplary current sensor (200) according to an embodiment of the present disclosure. This is an exemplary implementation of any of current sensors (A1, A2) of FIG. 1B. Inputs (21, 21') represent the voltage sensed across, for example, the in-line resistor (Rm1) of FIG. 1A. Resistor (Rm1) may have a resistance of, for example, 50 mΩ. A combination of resistors (R21, ..., R25) serve as an input voltage divider and resistor (R26) may be selected so that (op-amp) operational amplifier (22) has a unity gain. Depending on the requirements, the op-amp (22) common voltage may reach up to, for example, 40V and down to within the supply voltage (V1) of op-amp (22) which can be, for example, 15V. The disclosed voltage division feature allows op-amp (22) to have a stable unity gain whereas without this feature the op-amp (22) would need to have negative gain and potential instability.

With continued reference to FIG. 2, op-amp (22) may be implemented in a differential configuration with unity gain and referenced to voltage (V5). The value of reference voltage (V5) may be selected so that 0 current resides at the midpoint of the ADC (24) (which corresponds to ADC1 or ADC2 of FIG. 1B) input within a certain tolerance. This will allow a close to full range use of ADC (24) for improved resolution. Exemplary values for voltage (V5) and ADC (24) voltage range are 2.5V and 0 to 5V respectively. Op-amp (23) is arranged in a non-inverting amplifier configuration and gain resistors (R28, R29) may be selected to provide a desired gain. Moreover, op-amp (23) is also referenced to voltage (V5) for the same reason as disclosed above with regards to op-amp (22). Diodes (D1, ..., D6) may be implemented for excess voltage clipping purpose. The output of op-amp (23) is digitized by ADC (24) and the output (25) of ADC (24) is then sampled and processed by digital logic (109) of FIG. 1A.

Figure 3:
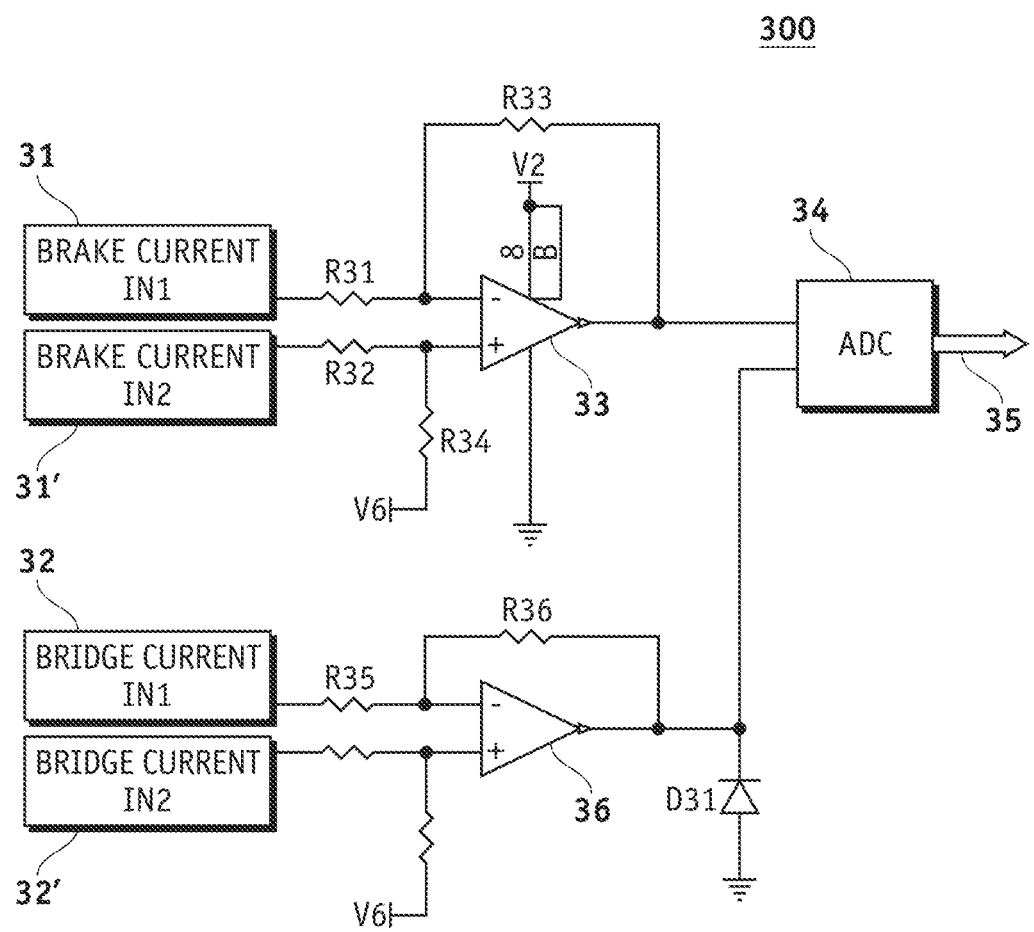
FIG. 3 shows an exemplary current sensor according to an embodiment of the present disclosure.

FIG. 3 shows an exemplary current sensor (300) according to an embodiment of the present disclosure. This is an exemplary implementation of any of current sensors (A3, A4) of FIG. 1B. Input pairs (31, 31') and (32, 32') represent the voltages sensed across respective sense resistors (Rb2, Rb1) of FIG. 1A. In contrast with motor phase current, brake and bridge currents are unidirectional with smaller values compared to motor phase currents which can be up to, for example, 3A. Op-amps (33, 36) are each single stage amplifiers arranged in differential configurations. Resistors (R31, ..., R26) are selected such that op-amps (33, 36) provide their respective desired gains. Outputs of op-amps (33, 36) are then digitized through their respective channels of ADC (34) (see ADC1 in FIG. 1B) and the output (35) of ADC (34) is then sampled and processed by digital logic (109) of FIG. 1A. Each circuit around op-amps (33, 36) is referenced to voltage (V6) to lift their readings into the linear range of their respective op-amp. Reference voltage (V6) may be set to, for example, 0.5V.

Figure 4:
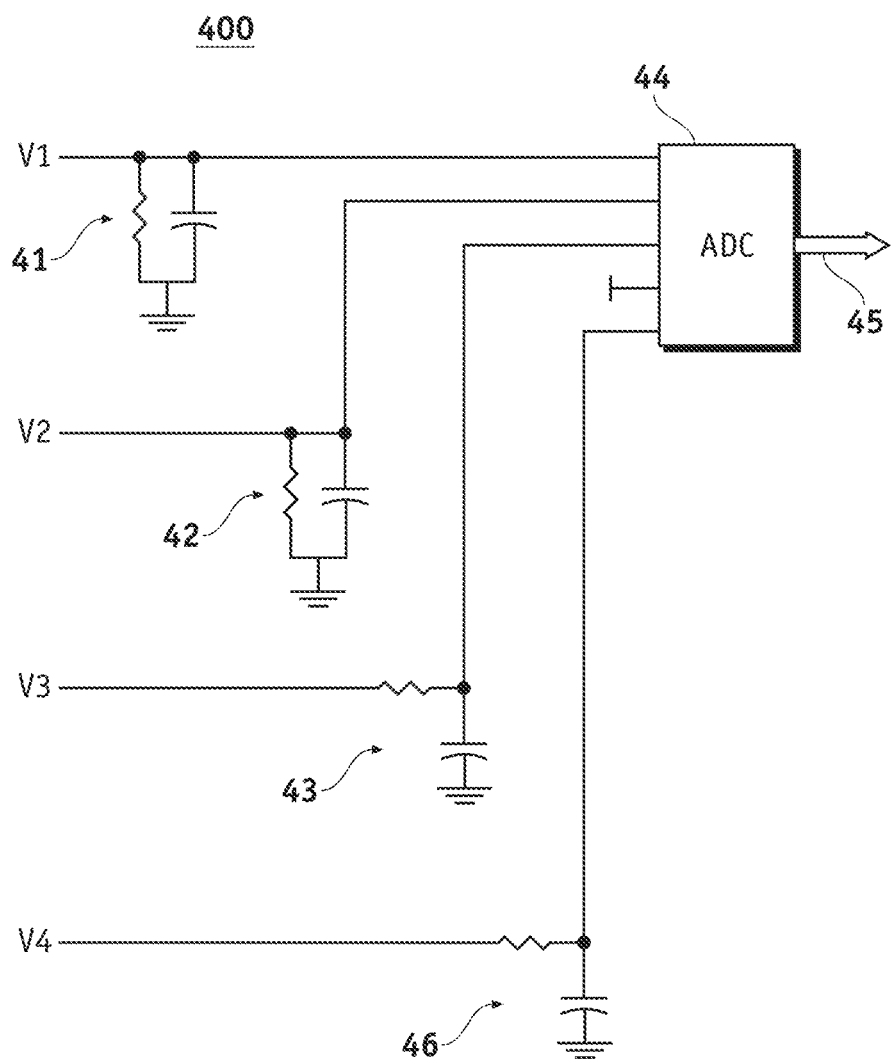
FIG. 4 shows an exemplary voltage sensor according to an embodiment of the present disclosure.

FIG. 4 shows an exemplary voltage sensor (400) according to an embodiment of the present disclosure. This is an implementation of the voltage sensor (105) of FIG. 1B. Input voltages (V1, ..., V4) are first low pass filtered (41, 42, 43, 46) to avoid possible undesired voltage glitches and the filtered voltages are then digitized through respective channels of ADC (44). The output (45) of ADC (44) is then sampled and processed by digital logic (109) of FIG. 1A.

Exemplary values for voltages (V1, V2, V3, V4) are 15 V, 5 V, 3.3 V, and 1.5 V respectively.

Figure 5:
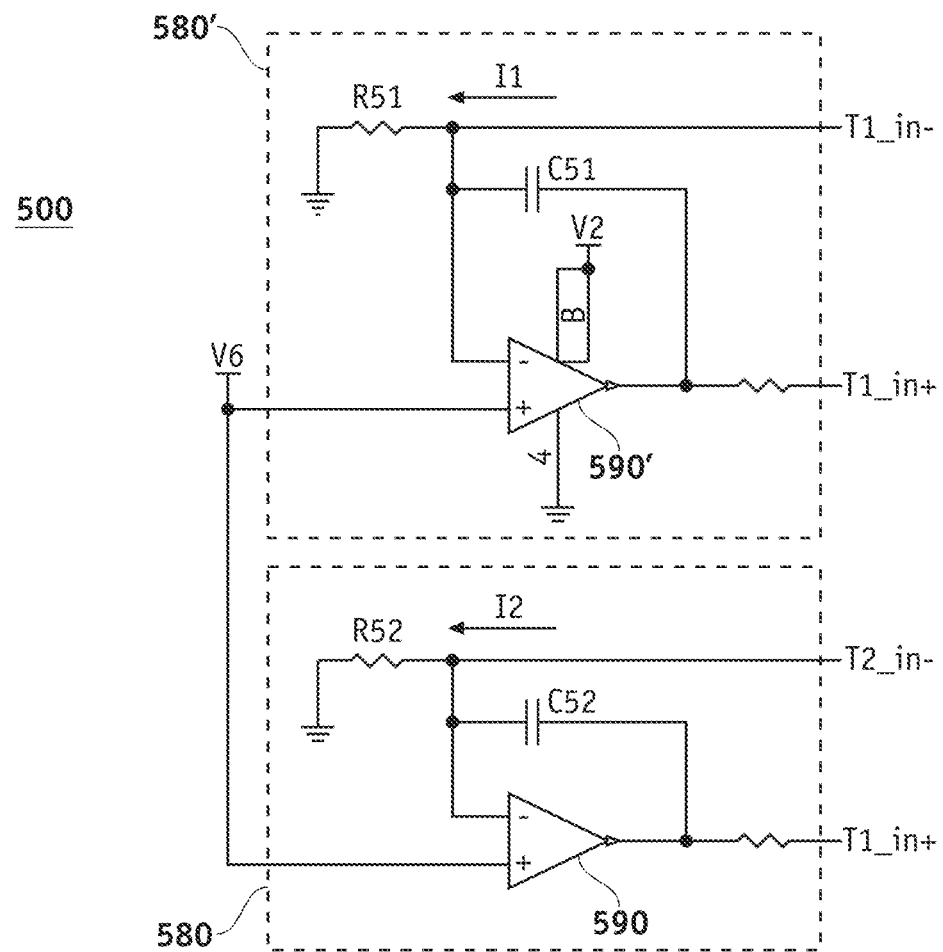
FIG. 5 shows an exemplary temperature sensor according to an embodiment of the present disclosure.

FIG. 5 shows an exemplary temperature sensor (500) according to an embodiment of the present disclosure. Temperature sensor (500) comprises two similar sensors (580, 580') used to measure the temperatures (T1, T2) of FIG. 1A. Sensors (580, 580') are exemplary implementations of temperature sensors (180, 180') of FIG. 1B respectively. Temperature sensor (500) further comprises two off-module platinum resistance thermometers (PRT), not shown in the figure, that are disposed off module. The first PRT is coupled across inputs (T1_in−, T1_in+) and the second PRT is coupled across inputs (T1_in−, T1_in+). The non-inverting input of each of the op-amps (590, 590') is tied to the reference voltage (V6) which can be set to, for example, 0.5V. In operative conditions, the inverting inputs of op-amps (590, 590') adjust to match the reference voltage (V6). As such, resistors (R51, R52) between the inverting op amp input and ground generate known currents of I1=V6/R51 and I2=V6/R52. Resistor (R51) may be, for example, a 499Ω resistor, and as such the current (I1) may be, for example, 0.5V/499Ω=1 mA flowing through the top PRT (not shown). The voltage at the PRT side that is opposite of the inverting input of the op-amp can be read, and therefore the temperature at the PRT can then be calculated from this voltage.

Referring back to FIGS. 1A, 1C, and 2, digital logic (109) has the functionality of processing measured data and controlling various electronic circuits of motor controller module (150). More in particular, as disclosed previously, digital logic (109) provides control pulses (PWM1, . . . , PWM6) to turn respective MOSFET switches to ON and OFF states, thereby providing the phase current needed by motor (108) to spin. The frequency of applying control pulses may be, for example, around 32 kHz. As also disclosed previously, the phase currents are measured by sensing the voltage across resistors (Rm1, or Rm2) disposed in line with respective motor phases. Such voltage appears across inputs (21, 21') of op-amp (22) of FIG. 2. When the MOSFET switches transition from the ON to OFF state or vice-versa, the voltage seen across the in-line resistor may experience a sharp change. As known in the art, when a change occurs in one of the op-amp inputs, the other input tracks such a change within a certain time and such tracking cannot occur instantaneously due to internal circuitry of the op-amp. As such, one of the challenges in measuring the motor current phase A and B is the disturbance of the common voltage of the various phases occurring due to the switching of MOSFET switches as described above. This issue is addressed by the disclosed methods and devices as described below.

Figure 6:
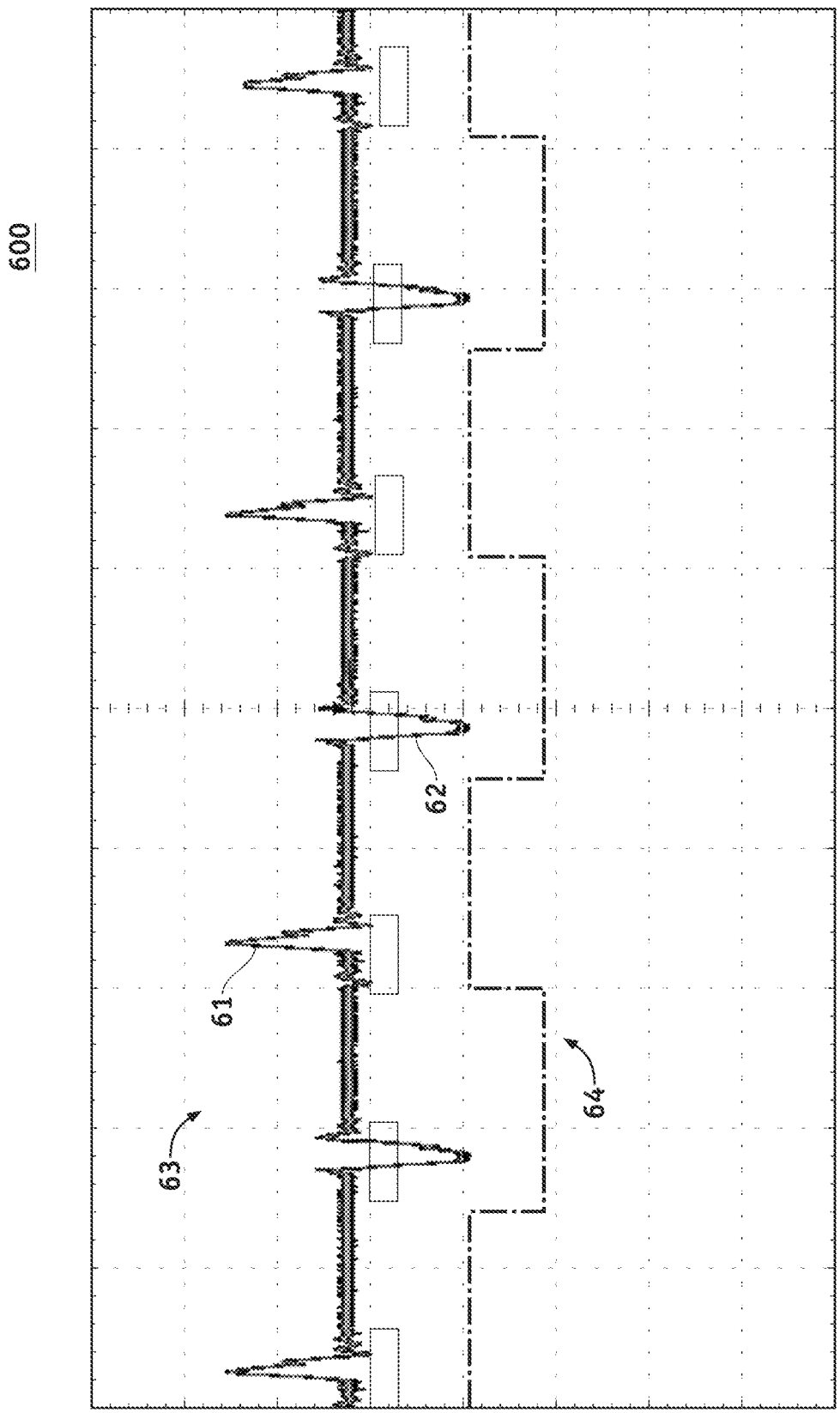
FIG. 6 shows an exemplary graph illustrating a motor phase current and its associated control pulse vs. time according to an embodiment of the present disclosure.

In order to further clarify the phase current measurement issue described above, reference is made to FIG. 6 which shows an exemplary graph (600) illustrating a motor phase current (63) and its associated control pulse (64) vs. time. As can be seen, spikes (61) may occur in phase current (63) whenever control pulse (64) change state from HIGH to LOW and vice-versa. The duration of such spikes may be around 6 µs.

Figure 7:
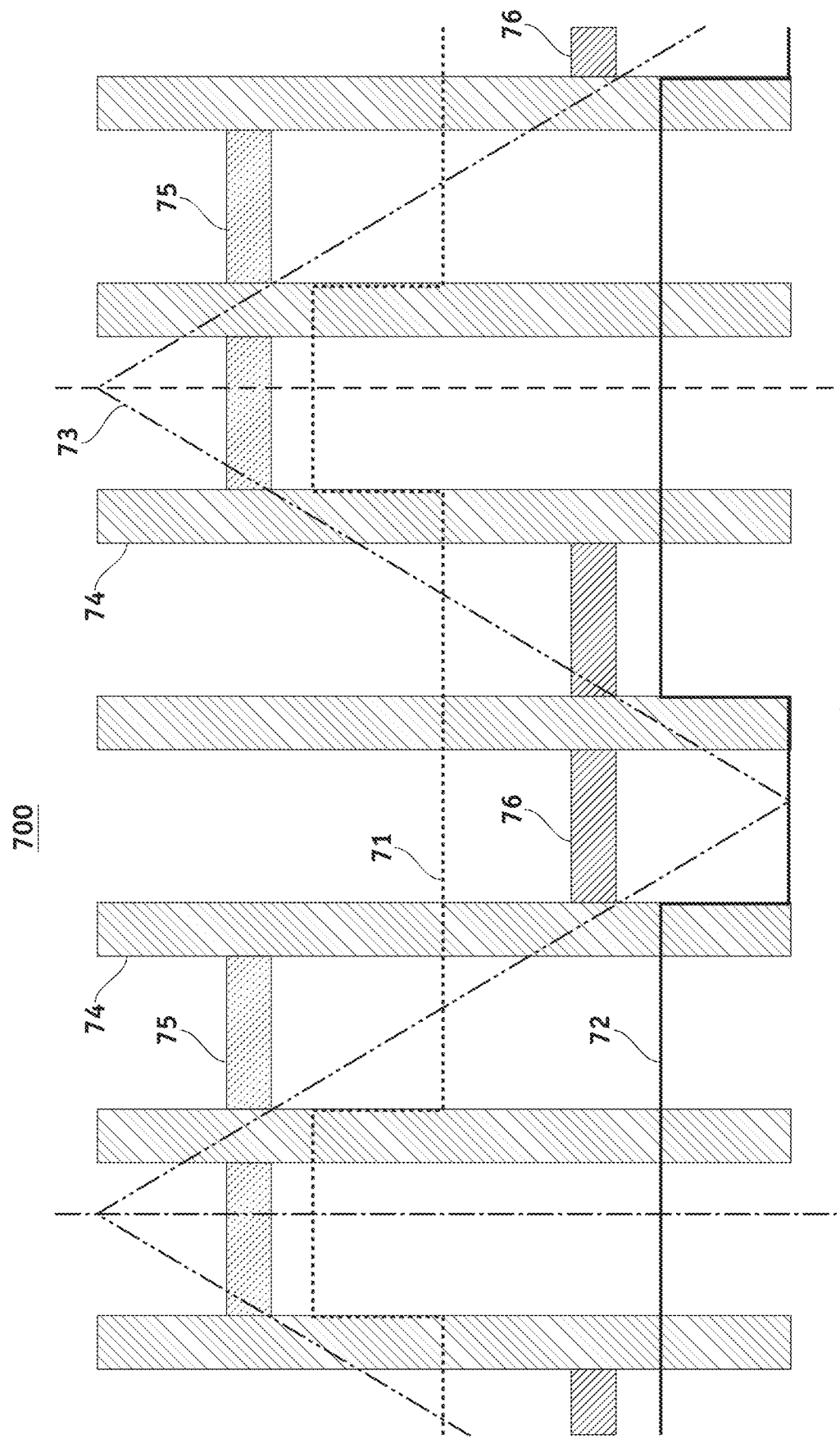
FIG. 7 shows an exemplary graph illustrating motor phase currents vs. time according to an embodiment of the present disclosure.

In accordance with the teachings of the present disclosure, phase current measurements are advantageously avoided during spikes occurring on either of phase A or phase B motor current. In order to illustrate such approach, reference is made to FIG. 7 showing graph (700) that include curves (71, 72) representing phase A motor current and phase B motor current (vertical axis) vs time (horizontal axis), respectively. Phase A spike time-intervals (75) (four of them shown in the top part of the figure) represent the time intervals when current spikes happen on the motor phase A current. Similarly, phase B spike time-intervals (76) (four of them shown in the bottom part of the figure) represent the time intervals when current spikes are present on the motor phase B current. In accordance with the teachings of the present disclosure, no phase current measurement is performed during such time intervals (75, 76). Graph (700) is essentially representative of a worst-case scenario, as it shows a non-overlapping distribution of time intervals (75, 76) when motor phase current measurements are not allowed to avoid possible transient spikes. As can be noticed, phase A and phase B spike time intervals (75, 76) occur during the transition from HIGH to LOW, or from LOW to HIGH of either of motor phase currents.

With continued reference to FIG. 7, phase current measurement intervals (74) are shown (seven vertical bars in the figure), which are time intervals during which both phase A and phase B motor current can be sampled simultaneously through corresponding channels of analog-to-digital converters (ADC1, ADC2) of FIG. 1B. As mentioned previously, the simultaneous sampling of the motor phase currents allows for a more accurate measurement of the motor current.

In general, measurements of the various parameters, i.e. motor phase current, bridge current, brake current, temperature and voltages are performed based on a scheduling algorithm executed as part of a firmware run by digital logic (109) of FIG. 1A. The scheduling algorithm is defined based on various considerations, one of them being the current spike issues appearing at certain time on the motor phase currents, as described previously.

With reference to FIGS. 1B-1C, the bridge current (IB) may only be sampled when at least one of the top MOSFET switches (SW1, SW3, SW5) and one of the bottom MOSFET switches (SW2, SW4, SW6) are turned on. The scheduling algorithm takes advantage of this fact by scheduling the bridge current (IB) measurement inside the phase current measurement intervals (74). This will prevent the bridge current measurement from competing with the phase current measurement, resulting in a more efficient scheduling algorithm. However, two possible issues may be taken into consideration when performing bridge current measurements. The first issue may occur in the scenario where the motor condition changes before the completion of the bridge current measurement. The second issue is the required delay to allow the signal to settle before the ADCs start their conversion. According to the teachings of the present disclosure, the scheduling algorithm provides two ADC conversions to account for such issues. In other words, a first bridge current measurement may be performed after a first delay, and a second bridge current measurement may be performed after a second delay, the second delay being longer than the first delay. Exemplary values for the first and the second delay are 3 and 6 µs respectively. In general, the second measurement performed after the second delay should be the more accurate one, and the first measurement may be used as a backup measurement.

Figure 8:
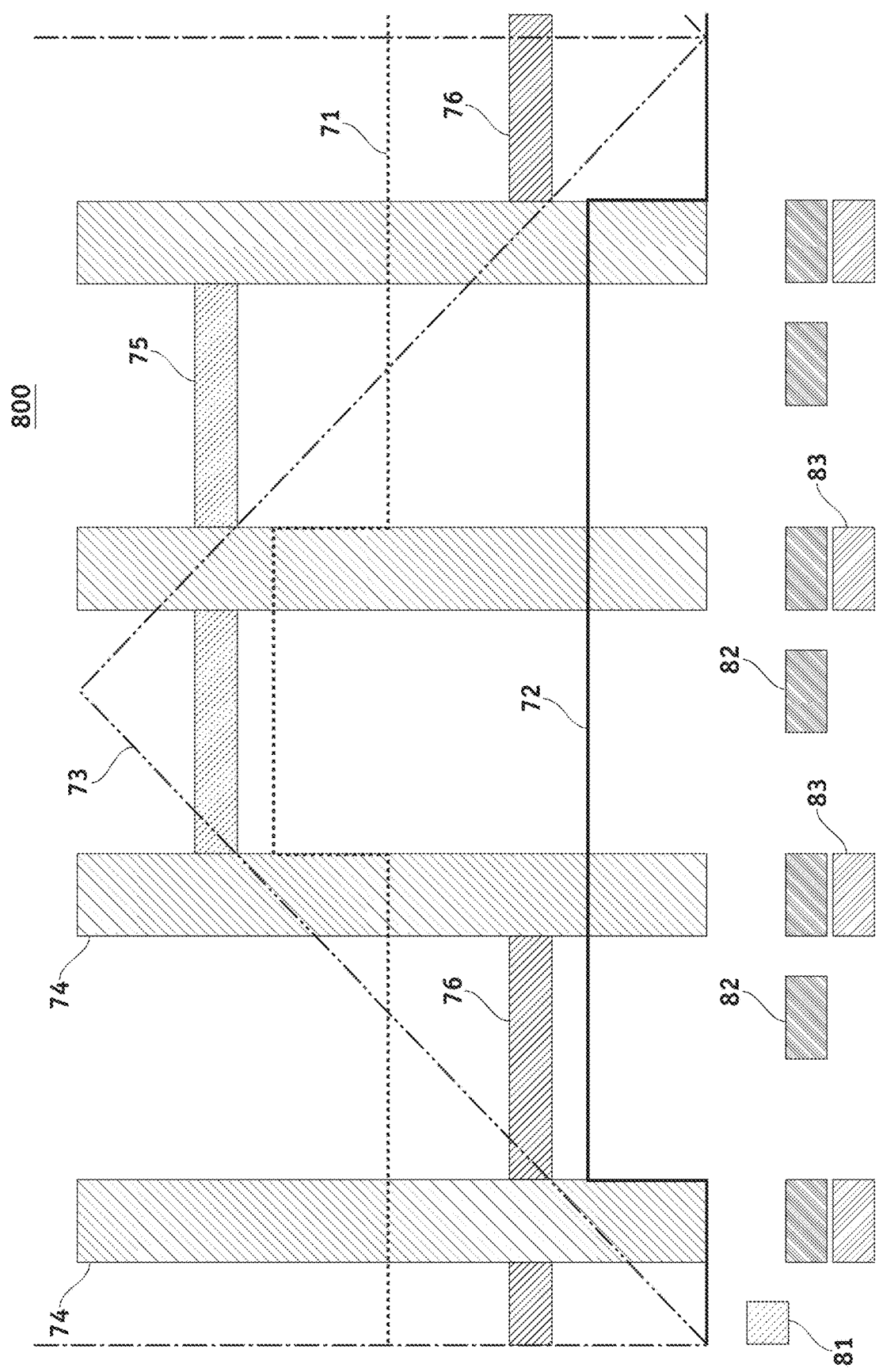
FIG. 8 shows a graph illustrating an exemplary scheduling of measurement according to an embodiment of the present disclosure.

According to an embodiment of the present disclosure, the scheduling algorithm may schedule the measurements of various parameters in any order as long as the potential issues as described previously are taken into consideration. FIG. 8 shows an example of how different measurements are scheduled sequentially. Measurement time intervals (81, 82, 83) correspond to the brake, bridge, and phase current measurement, respectively.

A number of embodiments of the disclosure have been described. Nevertheless, it will be understood that various modifications may be made without departing from the spirit and scope of the present disclosure. Accordingly, other embodiments are within the scope of the following claims.

The examples set forth above are provided to those of ordinary skill in the art as a complete disclosure and description of how to make and use the embodiments of the disclosure and are not intended to limit the scope of what the inventor/inventors regard as their disclosure.

Modifications of the above-described modes for carrying out the methods and systems herein disclosed that are obvious to persons of skill in the art are intended to be within the scope of the following claims.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. A A current sensing module for measuring a motor phase current, the current sensing module comprising:
   at least one sensing resistor disposed in-line with a phase of a motor; a current sensing circuit with two input terminals coupled across the at least one sensing resistor;
   the current sensing circuit being configured to amplify a voltage across the at least one sensing resistor, thereby generating an amplified voltage;
   a first operational amplifier with two first operational amplifier input terminals connected to the two input terminals;
   a resistive divider coupled to the first operational amplifier to reduce the voltage to or below a set voltage;
   an analog-to-digital converter configured to digitize the amplified voltage, thereby generating a digitized voltage;
   wherein
   a) the first operational amplifier is configured:
      i) to have a unity gain;
      ii) such that a full range of the analog-to-digital converter is centered a zero current,
      iii) the first operational amplifier is arranged in a non-inverting configuration
   b) the current sensing module is configured to operate at radiation levels of up to and including 300 Krad and survive temperatures down to and including −184° C.

2. The current sensing module of claim 1, further comprising digital logic circuitry configured to receive and process the digitized voltage.

3. The current sensing module of claim 1, further comprising a second operational amplifier coupled with the first operational amplifier, the second operational amplifier being configured to provide a gain of greater than unity.

4. A spacecraft comprising the current sense module of claim 1.

5. A current sensing module for measuring a motor phase current, the current sensing module comprising:
   at least one sensing resistor disposed in-line with a phase of a motor;
   a current sensing circuit with two input terminals coupled across the at least one sensing resistor;
   the current sensing circuit being configured to amplify a voltage across the at least one sensing resistor, thereby generating an amplified voltage;
   three half-bridge drivers comprising MOSFET switches, each MOSFET switch being configured to receive a corresponding control pulse;
   a temperature sensor configured to measure a temperature of the motor;
   a bridge current sensor configured to measure a bridge current of the motor;
   a brake current sensor configured to measure a brake current of the motor, and
   voltage sensors configured to monitor one or more supply voltages used by the current sensing module,
   wherein
      the current sensing module is configured to operate at radiation levels of up to and including 300 Krad and survive temperatures down to and including −184° C.
   the motor is a three-phase motor;
   the at least one sensing resistor comprises:
      (i) first sensing resistor disposed in-line with a first phase of the motor;
      (ii) a second sensing resistor disposed in-line with a second phase of the motor.
   the current sensing circuit comprises a first current sensing circuit and a second current sensing circuit;
   the first current sensing circuit is configured to amplify a first voltage across the first sensing resistor, thereby generating a first amplified voltage;
   the second current sensing circuit is configured to amplify a second voltage across the second sensing resistor, thereby generating a second amplified voltage;
   a first motor phase current is calculated based on the first amplified voltage;
   a second motor phase current is calculated based on the second amplified voltage, and
   a third motor phase current is calculated based on a combination of the first and the second amplified voltage.

6. The current sensing module of claim 5, further comprising a first analog-to-digital converter and a second analog-to-digital converter, wherein:
   the first analog-to-digital converter is configured to digitize the first amplified voltage, thereby generating a first digitized voltage;
   the second analog-to-digital converter is configured to digitize the second amplified voltage, thereby generating a second digitized voltage, and
   in operative conditions, the first and the second amplified voltages are digitized simultaneously.

7. The current sensing module of claim 6, further comprising digital logic circuitry configured to:
   receive and process the first and the second digitized voltages, and
   provide the control pulses.

8. The current sensing module of claim 5, further comprising one or more low-pass filters configured to filter the one or more supply voltages, thereby filtering out voltage transients.

9. A method of measurement comprising:
   providing the current sensing module of claim 5;
   identifying spike time intervals where current spikes does not occur on any of the first or the second motor phase currents;

simultaneously measuring the first motor phase current and/or the second motor phase current during measurement time intervals, the measurement time intervals being non overlapping with the spike time intervals.

10. The method of claim 9, further comprising measuring the bridge current at time intervals having overlaps with the spike time intervals.

11. The method of claim 10, wherein the measuring the bridge current comprises:
performing a first measurement of the bridge current with a first delay; and
performing a second measurement of the bridge current with a second delay longer than the first delay.

12. The method of claim 11, wherein the first delay is 3 us and the second delay is 6 us.

13. The method of claim 10, further comprising:
measuring the brake current of the motor;
measuring the temperature of the motor;
measuring of the one or more supply voltages;
wherein the measuring of the first and second phase motor currents, the bridge current, the brake current, and the temperature of the motor, and the one or more supply voltages is performed sequentially according to a set schedule implemented by the digital logic circuitry.

* * * * *